Figure 1:
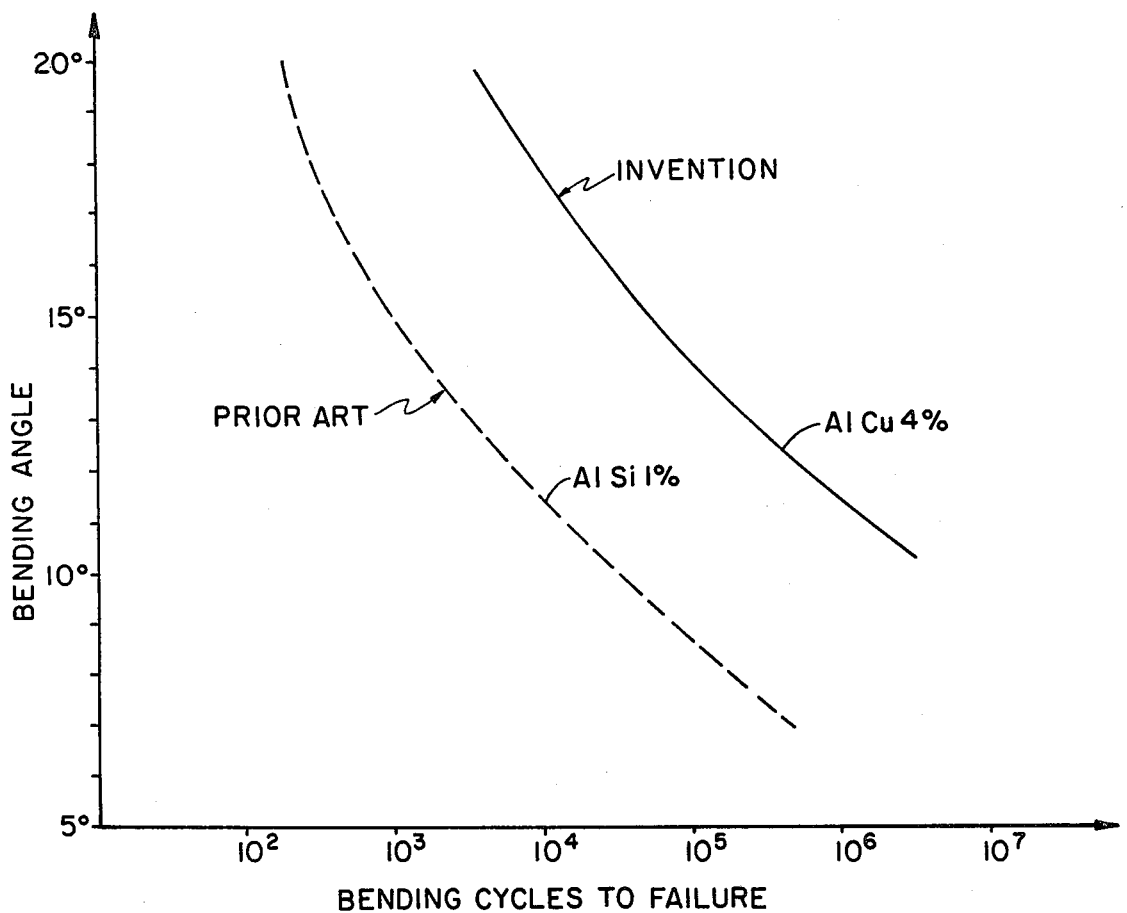

United States Patent [19]

Bischoff

[11] 4,380,775
[45] Apr. 19, 1983

[54] SEMICONDUCTOR UNIT WITH CONNECTING WIRES

[75] Inventor: Albrecht Bischoff, Bruchköbel, Fed. Rep. of Germany

[73] Assignee: W. C. Heraeus GmbH, Hanau, Fed. Rep. of Germany

[21] Appl. No.: 168,634

[22] Filed: Jul. 11, 1980

[30] Foreign Application Priority Data

Jul. 21, 1979 [DE] Fed. Rep. of Germany ....... 2929623

[51] Int. Cl.³ ..................... H01L 23/48; H01L 29/46; H01L 29/62
[52] U.S. Cl. ........................................ 357/67; 357/65; 428/607; 428/620; 29/591
[58] Field of Search ................... 357/65, 67; 428/607, 428/620; 29/591

[56] References Cited

U.S. PATENT DOCUMENTS

| | | | |
|---|---|---|---|
| 3,274,667 | 9/1966 | Siebertz | 357/65 |
| 3,743,894 | 7/1973 | Hall et al. | 357/67 |
| 4,027,236 | 5/1977 | Kummer et al. | 357/71 |
| 4,355,082 | 10/1982 | Bischoff et al. | 357/67 |

FOREIGN PATENT DOCUMENTS 286264 10/1928 United Kingdom .
313891 6/1929 United Kingdom .
546993 8/1942 United Kingdom .
836754 6/1960 United Kingdom .

OTHER PUBLICATIONS

Metals in the Service of Man, p. 79, Seventh Edition, 1980.
Aluminum-Taschenbuch (Aluminum Handbook) 13, Edition, 1974, p. 901.
IBM Technical Disclosure Bulletin, Aluminum Land Metallurgy with Copper on the Surface, by Daley et al., vol. 13, No. 6, Nov. 1970.

*Primary Examiner*—Andrew J. James
*Attorney, Agent, or Firm*—Frishauf, Holtz, Goodman & Woodward

[57] ABSTRACT

To reduce failure and breakage of connecting wires connecting specific zones on semiconductor chips to semiconductor frames, the connecting wires are made of an aluminum-copper alloy having, by weight, 3 to 5%, preferably 4% copper, the remainder aluminum (neglecting incidental impurities), the diameter of the wires being between about 0.01 to 0.06 mm, preferably about 0.02 to 0.05 mm, connected to the frame and the semiconductor, respectively, by ultrasonic bonding.

8 Claims, 2 Drawing Figures

SEMICONDUCTOR UNIT WITH CONNECTING WIRES

The present invention relates to a semiconductor unit with connecting wires of extreme fineness, or thinness, and to a connecting wire to connect a region or zone of a semiconductor chip to a semiconductor connecting element, such as a frame member.

BACKGROUND AND PRIOR ART

Tiny semiconductors which are formed on semiconductor chips, such as silicon chips, require connecting leads or connecting wire to external support structures which form terminals to which other wires then can be connected. These terminals are usually carried in frames. The wire size involved to connect a region on the semiconductor chip to the semiconductor frame—forming the terminals—is in the order of between 0.01 to 0.06 mm diameter. Electrical connection of a semiconductor to an external terminal of a carrier system or connecting frame usually was by means of wires of aluminum alloys which consisted essentially of 1% silicon and the remainder aluminum. The aluminum-silicon alloy fine connecting wires are quite suitable for most applications. It has been observed, however, that fatigue phenomena may occur which, particularly at the transition between the bonding point of the wire with the semiconductor and the immediately adjacent zone of the loop, forming the wire connection, may lead to breakage. Shocks and vibration to which the semiconductor may be subjected in use may lead to fatigue phenomena which then cause the connecting wire to break.

THE INVENTION

It is an object to provide a semiconductor with a fine, thin connecting lead having the diameters of prior art wires in which fatigue phenomena and breaks due to fatigue are eliminated or reduced to such an extent as to be negligible, and which, further, has similar excellent electrical and mechanical characteristics as the prior art aluminum-alloy wires.

Briefly, in accordance with the invention, the semiconductor has connecting wires of an aluminum copper alloy consisting essentially of between about 3 to 5% copper and 97 to 95% aluminum, by weight. In a particularly preferred form, the alloy consists essentially of 4% copper, the remainder aluminum, by weight. Surprisingly, it has been found that the aluminum copper alloy wires have a substantially better resistance to failure due to fatigue than wires made of aluminum-silicon alloys.

DRAWINGS

Figure 2:
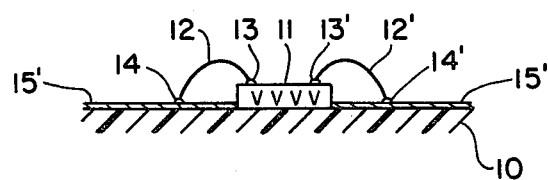

FIG. 1 is a graph comparing prior art connecting wires and wires made in accordance with the present invention, in which the ordinate shows bending angle and the abscissa the number of bending cycles to failure or break of the wire; and FIG. 2 is a highly schematic cross sectional view through a semiconductor chip connected to a metallic connecting frame by connecting wires.

A wire of 0.05 mm diameter made in accordance with the prior art—99% aluminum, 1% silicon (by weight) was compared with a wire in accordance with the present invention, 96% Al and 4% copper (by weight) and incidental impurities associated with the manufacture of the wire. The lattice structure of both wires was homogeneous. At small bending angles of up to 15%, the wires according to the present invention have an advantage of at least two orders of magnitude with respect to bending cycles to failure, as is clearly apparent from FIG. 1. Thus, the lifetime of the wire, when subjected to bending stresses, is substantially increased. The results represented by the graphs in FIG. 1 were obtained with customary apparatus to examine fatigue phenomena. The wires were formed with a predetermined notch, by compression of a zone of the wire, to provide a predetermined break point. The wires then were subject to alternate bending over a fixed bending angle until failure. The results are plotted on the graphs of the drawings, on which the compositions of the wire are also shown.

The fine wires made of the alumina copper alloy, and containing the preferred range of about 4% copper, is particularly suitable to connect semiconductor crystal zones to terminals of a semiconductor frame by making a connection by means of ultrasonic welding. The cross section of the dimension is not critical and, as required by the usual semiconductor manufacturing technology, can vary in the range of from about 0.01 to about 0.06 mm, preferably in a range of from 0.02 to 0.05 mm. The wires are made in customary wire drawing technology, by drawing down wires to the desired size, starting with wires having an aluminum-copper alloy of between 3 to 5% copper—by weight, preferably about 4%.

Aluminum-copper alloys with 4% copper, remainder aluminum—besides impurities—are known, and were used primarily for light-metal machine or cast elements used in aircraft and automotive applications.

The semiconductor structure in which the wires are used, as such, is well known. Reference, for example, is hereby made to U.S. Pat. No. 4,027,326, Kummer et al, assigned to the assignee of this application, the disclosure of which is hereby incorporated by reference, including references there cited which describe the arrangement of semiconductor chips in frame elements and illustrate the use of the connecting wire of the present invention in an integrated semiconductor structure. Such a structure is shown in highly schematic form in FIG. 2.

FIG. 2 illustrates an insulating support 10 on which a semiconductor chip 11 is mounted in convention manner. Connecting wires 12, 12' extend from an ultrasonic bond 13, 13' to ultrasonic bond points 14, 14' on metallic frame members 15, 15'.

Reference is made to U.S. Pat. No. 3,627,901, Marvin B. Happ, assigned to Texas Instruments Inc., especially to its FIG. 6 and the corresponding description, which discloses the use of wire leads in a semiconductor structure.

I claim:
1. A semiconductor unit comprising
   a semiconductor chip (11);
   a connecting frame (15, 15');
   and means connecting selected zones of the semiconductor chip to the frame comprising, in accordance with the invention,
   connecting lead wires consisting of a homogeneous aluminum-copper alloy, having a thickness of between about 0.01 mm to 0.06 mm, and in which the aluminum alloy consists essentially of 3 to 5% copper, the balance aluminum, by weight.

2. Semiconductor unit according to claim 1, wherein the wire consists essentially of 4% copper, the remainder aluminum, by weight.

3. Semiconductor unit according to claim 1 or 2, wherein the wire has a diameter between about 0.02 to 0.05 mm.

4. Semiconductor unit according to claim 1 or 2, wherein the connection (13, 14; 13', 14') between the connecting wire and the semiconductor, and the frame member, respectively, comprises an ultrasound bond.

5. Semiconductor according to claim 4, wherein the wire has a diameter between about 0.02 to 0.05 mm.

6. A connecting wire, particularly for connection of semiconductor elements to semiconductor frame terminal members and consisting of a homogeneous aluminum alloy which, essentially, has 3 to 5% copper, the remainder aluminum, and has a diameter of between 0.01 to 0.06 mm.

7. Wire according to claim 6, wherein the wire consists essentially of 4% copper, the remainder aluminum, by weight.

8. Wire according to claim 6 or 7, wherein the wire has a diameter of between 0.02 to 0.05 mm.

* * * * *